(12) United States Patent
Wyse

(10) Patent No.: US 8,497,730 B1
(45) Date of Patent: Jul. 30, 2013

(54) SYSTEM FOR AND METHOD OF MODIFYING IMPEDANCE CHARACTERISTICS OF CIRCUIT ELEMENTS

(75) Inventor: Russell D. Wyse, Center Point, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 160 days.

(21) Appl. No.: 13/156,731

(22) Filed: Jun. 9, 2011

(51) Int. Cl.
*H03B 1/00* (2006.01)
(52) U.S. Cl.
USPC ........ 327/551; 327/561; 327/308; 455/127.3; 326/30; 333/32
(58) Field of Classification Search
USPC .... 327/306, 308, 551–559, 561, 564; 333/32; 336/10; 326/30; 455/127.2–127.3, 232.1, 455/234.1, 253.2; 324/709; 330/69
See application file for complete search history.

(56) References Cited

U.S. PATENT DOCUMENTS 4,882,541 A * 11/1989 Haragashira ............... 324/322

* cited by examiner

*Primary Examiner* — Long Nguyen
*Assistant Examiner* — Thomas Skibinski
(74) *Attorney, Agent, or Firm* — Donna P. Suchy; Daniel M. Barbieri

(57) ABSTRACT

A circuit includes a passive element having an impedance. An active circuit can be configured to receive an impedance signal associated with the impedance. The impedance includes a real portion and an imaginary portion. The active circuit removes at least a portion of the real portion of the impedance signal. The circuit can be utilized in a wide array of applications including radio applications.

21 Claims, 6 Drawing Sheets

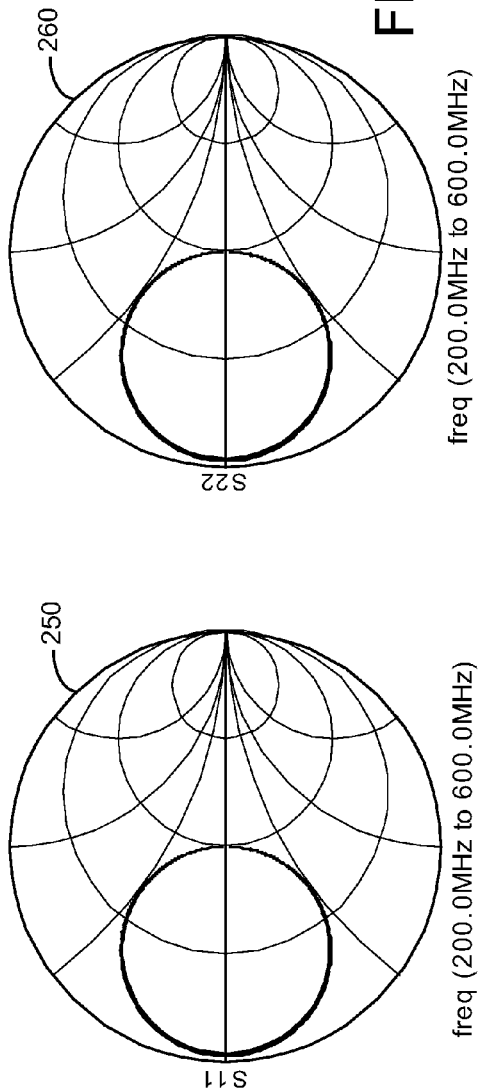
FIG. 8
FIG. 9
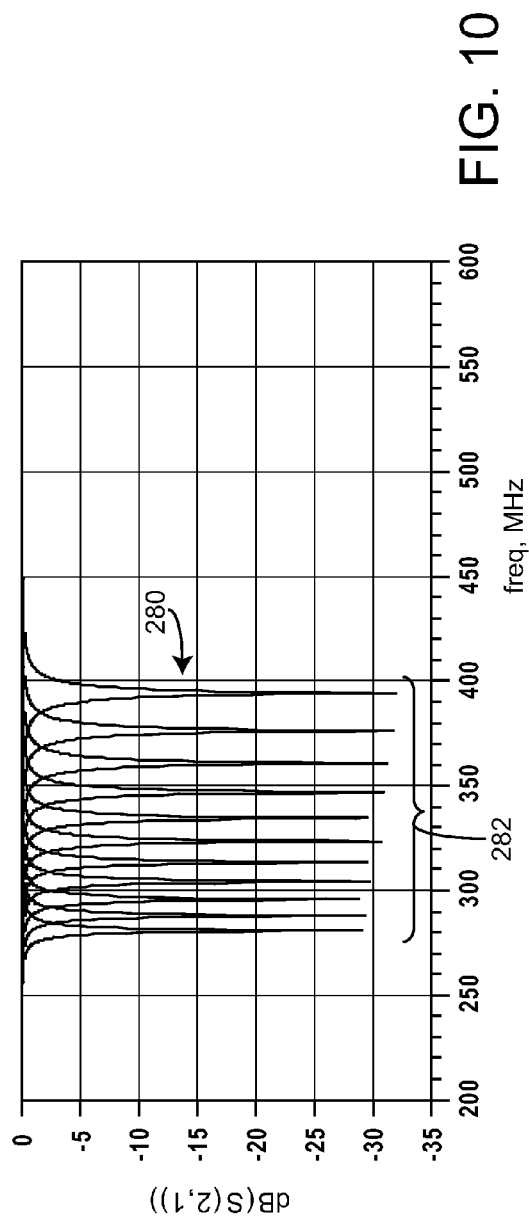
FIG. 10

SYSTEM FOR AND METHOD OF MODIFYING IMPEDANCE CHARACTERISTICS OF CIRCUIT ELEMENTS

BACKGROUND

The present disclosure generally relates to the field of circuit elements. More particularly, the present application relates to modification of impedance characteristics of circuit elements.

Circuit elements include active and passive elements and are used in virtually all electronic applications. Passive elements include inductors, capacitors and resistors. Passive elements are used in radio architectures as well as other high, medium and low frequency and direct current applications.

Radio architectures are often used in communication equipment, computers, sensing equipment, and other RF circuits which have challenging size, weight, power and cost (SWPC) requirements. Generally, radio architectures often utilize filters and other circuits that require passive elements with large reactive characteristics. Passive elements, such as capacitors and inductors, with large reactive characteristics often have SWPC issues.

Further, radio architectures often require high quality programmable filters which can require circuitry with adjustable impedances. Passive elements with adjustable impedances often have significant SWPC issues.

On-chip or non-discrete passive elements have been designed to reduce SWPC issues. Generally, on-chip or non-discrete capacitors and inductors have impedance characteristics that are not optimum for all applications. For example, on-chip inductors can have relatively low inductances and low-Q-factors (the ratio of inductance to resistance). On-chip capacitors can have similar issues.

Thus, there is also a need for a system for and a method of improving impedance characteristics of circuit elements, such as passive elements. Further still, there is a need for improving impedance characteristics for passive elements used in radio applications as well as low, medium and high frequency applications. Further still, there is a need for passive elements that are smaller, lighter, less expensive and have smaller power requirements and yet have suitable reactive characteristics. Further still, there is a need for tunable passive elements which can be provided at lower cost, at lower weight, and in a smaller package and which use less power.

Further, there is a need for improvements in impedance characteristics associated with passive elements (especially on-chip passive elements) that would allow for dramatic improvements in SWPC, Q-capabilities, tunable filtering, etc. Further, there is a need for improvements in impedance characteristics that can translate into an increase in integration capability for a number of electronic applications including radio architectures.

Further still, there is a need for a system for and method of improving impedance of circuit elements which can utilize various process technologies such as silicon, silicon germanium, gallium arsenide, gallium nitride, bipolar, CMOS, PHEMT, etc. Further still, there is a need for a topology which provides improved impedance characteristics in radio frequency (RF) applications.

SUMMARY OF THE INVENTION

An exemplary embodiment relates to an apparatus. The apparatus includes a passive element having an impedance. An active circuit is configured to receive an impedance signal associated with the impedance. The impedance includes a real portion and an imaginary portion. The active circuit increase or decrease the real portion or the imaginary portions using active feedback.

An exemplary embodiment can relate to an active circuit configured to take a resistive (real portion of impedance) signal and increase or decrease the associated real portion of the total impedance signal. The real portion can be increased or decreased using active feedback (e.g., summing these signals together).

Another embodiment relates to a radio. The radio includes a set of variable gain amplifiers (VGA's) for receiving an impedance signal associated with a passive element and a real portion signal associated with the impedance signal. The VGA's are configured so the feedback removes an amplified version of the real portion signal from an amplified version of the impedance signal.

Another exemplary embodiment relates to a method. The method adjusts impedance of a passive element. The method includes receiving a first impedance signal and providing a first amplified impedance signal. The method also includes receiving a second impedance signal and providing a second amplified impedance signal. The method further includes summing the first amplified impedance signal and the second amplified impedance signal using active feedback. The gain and phase settings on the VGA's cause the summing of these signals to increase or decrease the total real and imaginary components of circuit element.

Another embodiment relates to an apparatus. The apparatus includes a passive element and an active circuit. The active circuit is configured to provide a negative inductive or capacitive effect for the passive element.

BRIEF DESCRIPTION OF THE DRAWINGS

Preferred exemplary embodiments will hereinafter be described with reference to the accompanying drawings, wherein like numerals denote like elements and:

FIG. 8 is a Smith chart showing impedance at port S11 for the filter illustrated in FIG. 7 in accordance with another exemplary embodiment;

FIG. 9 is a Smith chart showing impedance at port S22 for the filter illustrated in FIG. 7 in accordance with another exemplary embodiment;

FIG. 10 is an s-parameter insertion loss diagram showing the frequency response of the filter illustrated in FIG. 7 where the gain settings of variable gain amplifiers are used to tune the filter characteristic.

DETAILED DESCRIPTION OF THE PREFERRED EXEMPLARY EMBODIMENTS

Figure 1:
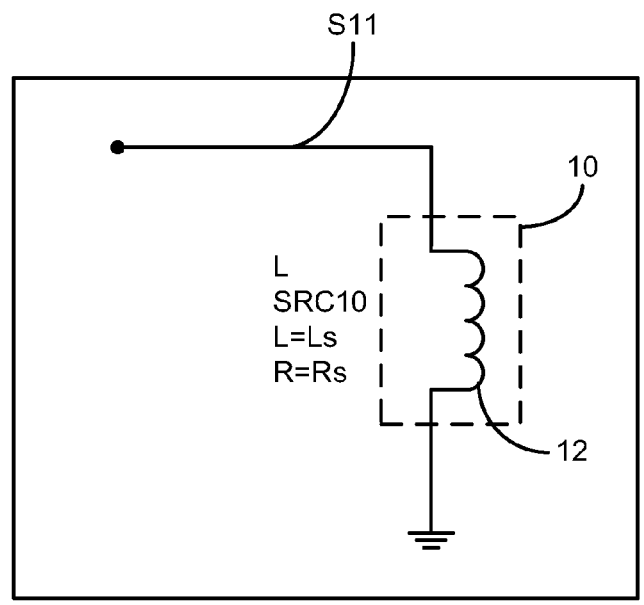
FIG. 1 is a schematic circuit diagram representing a conventional circuit coupled to a network analyzer port including a passive elements in accordance with an exemplary embodiment.

Before describing in detail the particular improved system and method, it should be observed that the invention includes arrangements of circuit components, but is not limited to, not to the particular detailed configurations thereof. Accordingly, the structure, methods, functions, control and topology, for the most part, have been illustrated in the drawings by readily understandable block diagrams and electrical schematic diagrams, in order not to obscure the exposure with structural details which will be readily apparent to those skilled in the art, having the benefit of the description herein. The system for and method of the present invention is applicable to any circuitry in which modification of impedance is desired or necessary.

Referring generally to the figures, a system for and method of adjusting impedance for at least one passive element is described. The passive elements can be inductive, capacitive or resistive. The system and method advantageously can provide an activated passive element, which has a fixed or adjustable impedance. In certain embodiments, the impedance can be adjusted to improve Q factor, inductance, capacitance, or achieve tuneable filtering. The advantageous approach of modifying passive element impedance characteristics can provide dramatic improvement to size, weight, power and cost characteristics.

With reference to FIG. 1, a circuit 10 can include passive element 12. A port S11 represents the point where electrical energy will impact passive element 12 (e.g., anyplace the inductor would be used in a circuit) and is representative of measuring the impedance of element 12. Although shown with one element, circuit 10 can include other passive or active elements. Passive element 12 can be an inductor. Element 12 can also be a capacitor or other type of passive element.

In one embodiment, element 12 is an on-die or integrated circuit (IC) inductor. Element 12 can have a resistance equal to $R_s$ and an inductance equal to $L_s$. Alternatively, element 12 can be an on-die capacitor having a series resistance of $R_s$ and capacitance of $C_s$. According to another alternative, element 12 can be a resistor and its impedance can be actively modified.

Generally, element 12 is a lossy on-die inductor associated with conventional manufacture. IC fabricators can provide values for inductance, $L_s$, and series resistance, $R_s$ for passive element 12. Element 12 can be an inductor having various values for $L_s$ and $R_s$. For example, in one embodiment, element 12 can have an inductance of 10 nanohenry and a resistance of 10 ohms. In another embodiment, element 12 can have a capacitance of 10 pico Farads (pF) and a resistance of 1.0 ohms. The values for $C_s$ and $L_s$ and $R_s$ are exemplary only.

Figure 2:
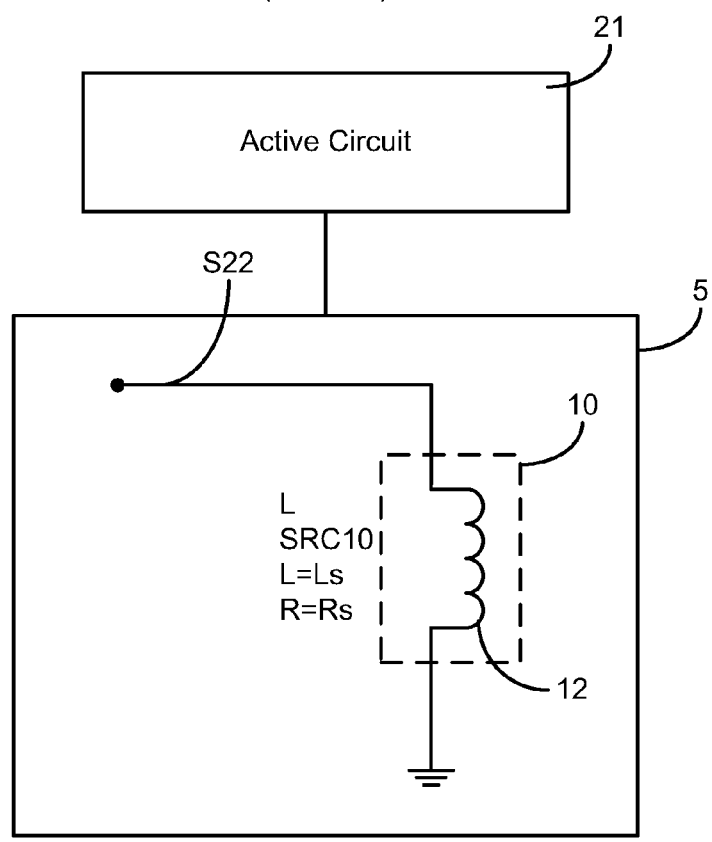
FIG. 2 is a general block diagram of an active circuit coupled to the circuit illustrated in FIG. 1, in accordance with another exemplary embodiment in the present invention.

With reference to FIG. 2, circuit 10 is coupled to an active circuit 21 at port S22. Port S22 represents the point where electrical energy will impact passive element 12 (e.g., any place the inductor would be used in a circuit) and is representative of measuring the impedance 12.

Active circuit 21 advantageously provides adjustment to the impedance characteristics associated with circuit 10 and in particular to element 12 according to one preferred embodiment. Active circuit 21 operates to provide an activated passive element, wherein the passive element is activated to improve its impedance characteristics. For example, improvements to impedance characteristics may reduce the required size for a printed inductor, such as, element 12. In one embodiment, dramatic electrical performance improvements in characteristics for on-die inductors can be achieved.

In a preferred embodiment, active circuit 21 can be coupled to circuit 12 at port S22. Active circuit 21 operates to magnify the total impedance of element 12 and subtract out the real portion associated with the total impedance using amplifier circuitry. Such an approach can modify impedance characteristics of passive element 12 to allow for dramatic improvements in reactive characteristics, SWPC, Q factor, tunable filtering, etc. In one embodiment, active circuit 21 independently controls the imaginary or reactive portion and the real or resistive portion of lossy passive elements, such as, element 12, so that the appropriate impedance can be achieved.

The SWPC advantages associated with modifying impedance characteristics are particularly beneficial for complex radio architectures and advanced radio applications. These advantages include dramatic increase in integration capability by reducing the required size of printed inductors. In one embodiment, smaller inductors can be utilized and the inductance can be magnified using active circuit 21. Similarly, smaller capacitors can be utilized and capacitance can be magnified using active circuit 21 in one embodiment. Further, the Q factors of passive elements such as element 12 can also be advantageously dramatically increased by subtracting out the real portion of total impedance and/or amplifying the reactive characteristics in one embodiment. Further still, tunable architectures can be achieved by controlling the impedances of passive elements by modifying the gain associated with active circuit 21 in one embodiment.

Active circuit 21 is preferably process flexible and can be constructed in silicon, silicon germanium, gallium arsenide, gallium nitride, bipolar technologies, CMOS technologies, FET technologies, PHEMT technologies, etc. Active circuit 21 can be a circuit including RF amplifiers. Active circuit 21 can be a hardwired circuit, an ASIC, or a programmable logic. In one embodiment, circuit 10 shares a substrate and/or integrated circuit package with circuit 21. In other embodiments, circuit 10 can be on a different substrate in the same integrated circuit package or in a different integrated circuit package than circuit 21.

Figure 3:
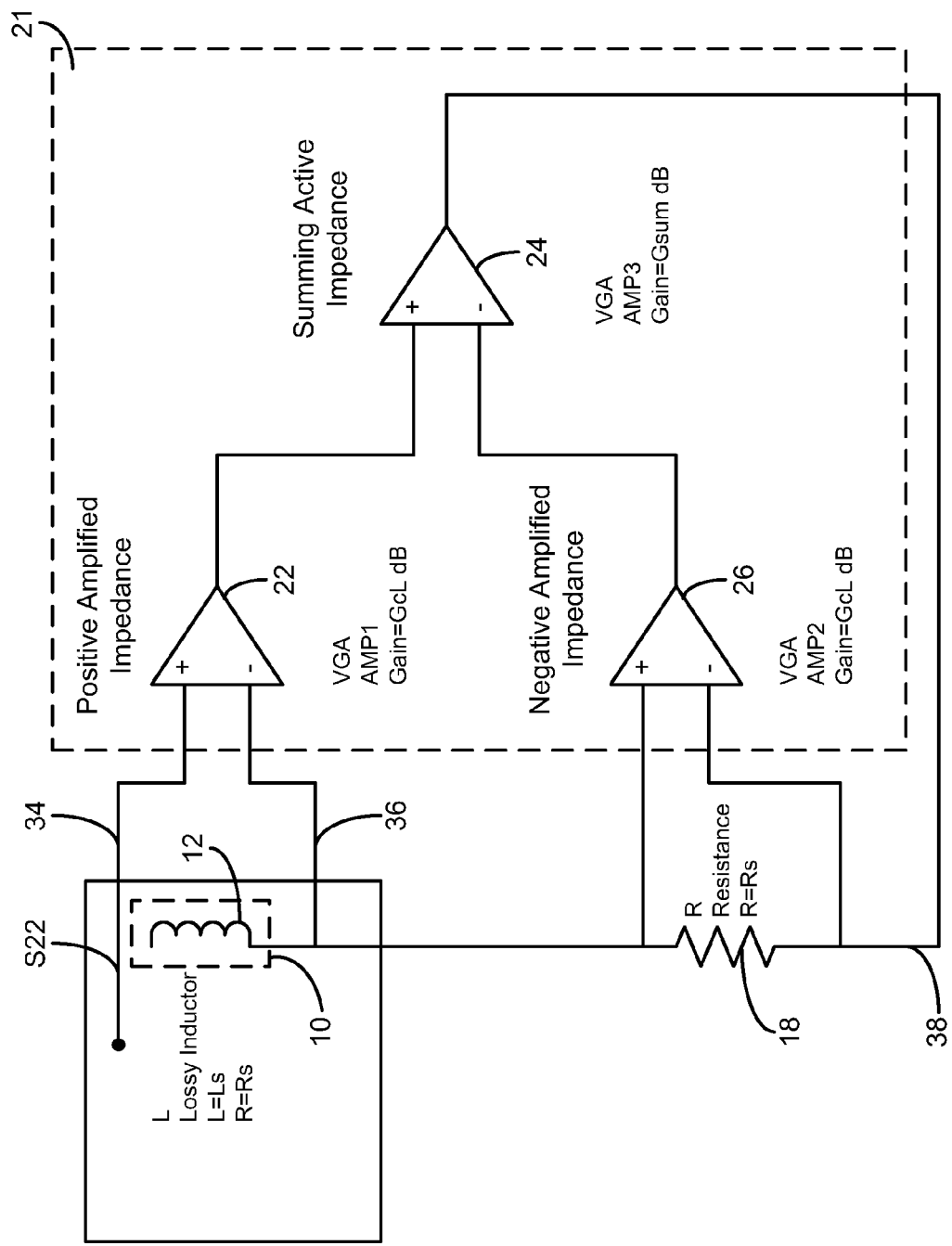
FIG. 3 is a schematic circuit diagram of the active circuit illustrated in FIG. 2 in accordance with another exemplary embodiment.

With reference to FIG. 3, active circuit 21 includes a variable gain amplifier (VGA) 22, a VGA 24 and a VGA 26. VGAs 22, 24, 26 are preferably radio frequency (RF) VGAs configured as differential amplifiers. VGA 22 is preferably configured as a differential amplifier having a positive input terminal coupled to a node 34 and a negative input terminal connecting to a node 36 between an element 18 and element 12. Element 18 is preferably a resistor having a resistance related to series resistance of element 12. Although shown as a resistor in FIG. 3, element 18 could be an element that exhibits frequency dependent behavior, such as an inductor, capacitor, or other element.

VGA 26 is preferably configured as a differential amp having a positive input terminal connected to node 36 between element 12 and element 18 and a negative input terminal connected a node 38 between an output of VGA 24 and element 18. An output of VGA 26 is coupled to a negative input of VGA 24 and a positive input of VGA 24 is coupled to an output of amplifier 22.

According to one embodiment, VGA 22 is configured to provide a positive amplified impedance signal to VGA 24. VGA 26 is configured to provide an amplified resistance signal to VGA 24 such that the summation of signals on the output of VGA 24 subtracts the amplified resistance signal from the amplified impedance signal. The output of VGA 24 is combined at node 38 to provide an actively modified ground in one embodiment.

The positive amplified impedance signal preferably represents the total impedance associated with passive element 12. The negative amplified resistance signal represents the series resistance or real portion of the impedance associated with passive element 12. The sum of the positive amplified impedance signal and the negative amplified resistance signal represents the modified impedance in one embodiment.

Preferably, resistor 18 has a resistance that is related to $R_s$, the resistance associated with element 12. In this way, the resistance associated with element 12 can be subtracted using active circuit 21 in one embodiment. Alternatively, different resistances can be utilized and gains can be adjusted using VGAs 22 and 26 to appropriately subtract out resistance associated with element 12. The Q factor for element 12 can be adjusted using circuit 21. The ratio of $L_s$ to $R_s$ can be referred to as the Q factor for element 12.

In one embodiment, VGA 22 amplifies or magnifies the total reactive characteristic of element 12. VGA 26 serves to provide a waveform for subtracting out the real portion of the impedance. VGA 24 combines the waveforms together so that the reactance associated with element 12 is increased and the resistance associated with element 12 is decreased, thereby increasing the Q factor according to one embodiment. Active circuit 21 preferably provides positive feedback for the reactance and negative feedback for the resistance using the combined waveforms through element 18 to node 38 which serves as a modified ground.

VGA's 22, 24 and 26 can operate at various frequencies including megahertz (MHz) to Gigahertz (GHz) in certain embodiments depending on technology and circuitry. VGA 22 preferably has a gain of $G_{CL}$ in dB and VGA 24 preferably has a gain of $G_{CR}$ in dB. VGA 26 has a gain of $G_{sum}$ in dB. In one embodiment, $G_{CL}$ is equal to $G_{CR}$ and $G_{sum}$ is 0 db or unity.

Circuit 10 can be utilized in a variety of applications. One preferred application is in radio system (e.g., a radio frequency (RF) system). Alternatively, circuit 10 can be utilized in a sensor, computer, communication system, network, or other application requiring the reception of signals, matching and/or filtering. The present invention is not limited to any particular type of application or range of frequencies.

Figures 4, 5, 6:
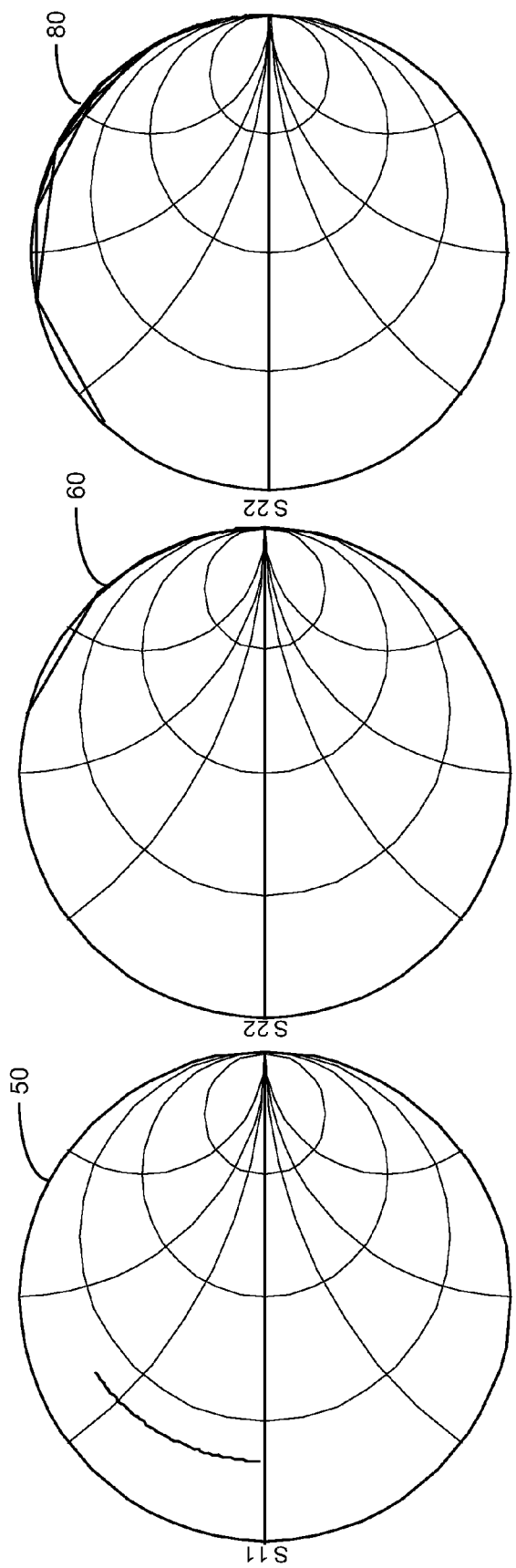
FIG. 4 is a Smith chart showing impedance characteristics of the conventional circuit illustrated in FIG. 1 where the actively compensated electrical parameters show a large increase in the overall inductance and Q.
FIG. 5 is a Smith chart showing impedance characteristics of the circuit illustrated in FIG. 1 when coupled to the active circuit illustrated in FIGS. 2 and 3 in accordance with yet another exemplary embodiment.
FIG. 6 is a Smith chart showing impedance characteristics of the circuit illustrated in FIG. 1 when coupled to the active circuit illustrated in FIGS. 2 and 3 utilizing a number of gain values in accordance with yet another exemplary embodiment.

With reference to FIG. 4, a Smith chart 50 shows impedance characteristics of passive element 12 without the use of circuit 21 according to software simulations. Values of impedance for element 12 at terminal or port S11 without the use of circuit 21 are shown in Table 1 below at frequencies between 10 MHz and 130 MHz. Inductance is in nH and resistance is in ohms.

TABLE 1

| FREQ. | Rin Ohms | Lin × $10^{-9}$ Henries |
| --- | --- | --- |
| 10.00 MHz | 10.000 | 10.000 |
| 20.00 MHz | 10.000 | 10.000 |
| 30.00 MHz | 10.000 | 10.000 |

TABLE 1-continued

| FREQ. | Rin Ohms | Lin × $10^{-9}$ Henries |
| --- | --- | --- |
| 40.00 MHz | 10.000 | 10.000 |
| 50.00 MHz | 10.000 | 10.000 |
| 60.00 MHz | 10.000 | 10.000 |
| 70.00 MHz | 10.000 | 10.000 |
| 80.00 MHz | 10.000 | 10.000 |
| 90.00 MHz | 10.000 | 10.000 |
| 100.00 MHz | 10.000 | 10.000 |
| 110.00 MHz | 10.000 | 10.000 |
| 120.00 MHz | 10.000 | 10.000 |
| 130.00 MHz | 10.000 | 10.000 |

With reference to FIG. 5, a Smith chart 60 shows impedance characteristics of element 12 using active circuit 21 according to software simulations. The gains $G_{CL}$ and $G_{CR}$ are equal to each other and are set to approximately 35 in one embodiment. In other embodiments, gains $G_{CL}$ and $G_{CR}$ can be between 0-50 dB. According to exemplary embodiments, gains $G_{CL}$ and $G_{CR}$ can be different than each other. The gain Gsum is set to 0 dB in one embodiment. Table 2 below shows resistance (ohms) and impedance (nH) values at frequencies between 10 MHz and 130 MHz.

TABLE 2

| FREQ. | Ro Ohms | Lo × $10^{-9}$ Henries |
| --- | --- | --- |
| 10.00 MHz | 0.180 | 1021.952 |
| 20.00 MHz | 0.187 | 1021.952 |
| 30.00 MHz | 0.198 | 1021.952 |
| 40.00 MHz | 0.213 | 1021.952 |
| 50.00 MHz | 0.234 | 1021.952 |
| 60.00 MHz | 0.258 | 1021.952 |
| 70.00 MHz | 0.287 | 1021.952 |
| 80.00 MHz | 0.321 | 1021.952 |
| 90.00 MHz | 0.359 | 1021.952 |
| 100.00 MHz | 0.402 | 1021.952 |
| 110.00 MHz | 0.449 | 1021.952 |
| 120.00 MHz | 0.500 | 1021.952 |
| 130.00 MHz | 0.558 | 1021.952 |

As shown in Tables 1 and 2, active circuit 21 modifies element 12 so that inductance is changed from 10 nanohenrys with 10 ohms equivalent series resistance to approximately 1 microhenry with less than 1 ohm series resistance at a frequency between 10 and 130 MHz in one embodiment.

With reference to FIG. 6, a Smith chart 80 shows impedance characteristics for element 12 using active circuit 21 across a gain sweep according to a software simulation. Table 3 below shows impedance values at various frequencies and gains. Table 3 below shows frequency, resistance and inductance values for gains $G_{cL}$ and $G_{cR}$ of 20, 30, 40 and 50 dB. $G_{cL}$ and $G_{cR}$ are equal according to one embodiment. The gain Gsum is 0 dB or unity.

TABLE 3

| | Ro Ohms | | | | | Lo × 10⁻⁹ Henries | | | | |
|---|---|---|---|---|---|---|---|---|---|---|
| FREQ. | Gain 10.000 | Gain 20.000 | Gain 30.000 | Gain 40.000 | Gain 50.00 | Gain 10.000 | Gain 20.000 | Gain 30.000 | Gain 40.000 | Gain 50.000 |
| 10.00 MHz | 0.178 | 0.179 | 0.180 | 0.181 | 0.183 | 326.236 | 642.470 | 958.705 | 1274.941 | 1591.177 |
| 20.00 MHz | 0.179 | 0.181 | 0.186 | 0.191 | 0.199 | 326.236 | 642.470 | 958.705 | 1274.941 | 1591.177 |
| 30.00 MHz | 0.180 | 0.186 | 0.195 | 0.209 | 0.225 | 326.236 | 642.470 | 958.705 | 1274.941 | 1591.177 |
| 40.00 MHz | 0.182 | 0.192 | 0.209 | 0.233 | 0.262 | 326.236 | 642.470 | 958.705 | 1274.941 | 1591.177 |
| 50.00 MHz | 0.184 | 0.201 | .0227 | 0.264 | 0.310 | 326.236 | 642.470 | 958.705 | 1274.941 | 1591.177 |
| 60.00 MHz | 0.187 | 0.211 | 0.249 | 0.301 | 0.368 | 326.236 | 642.470 | 958.705 | 1274.941 | 1591.177 |
| 70.00 MHz | 0.190 | 0.223 | 0.275 | 0.346 | 0.437 | 326.236 | 642.470 | 958.705 | 1274.941 | 1591.177 |
| 80.00 MHz | 0.194 | 0.237 | 0.304 | 0.398 | 0.516 | 326.236 | 642.470 | 958.705 | 1274.941 | 1591.176 |
| 90.00 MHz | 0.199 | 0.252 | 0.338 | 0.456 | 0.606 | 326.236 | 642.470 | 958.705 | 1274.941 | 1591.176 |
| 100.00 MHz | 0.204 | 0.270 | 0.376 | 0.521 | 0.707 | 326.236 | 642.470 | 958.705 | 1274.941 | 1591.176 |
| 110.00 MHz | 0.209 | 0.289 | 0.417 | 0.593 | 0.818 | 326.236 | 642.470 | 958.705 | 1274.941 | 1591.176 |
| 120.00 MHz | 0.215 | 0.310 | 0.463 | 0.673 | 0.940 | 326.236 | 642.470 | 958.705 | 1274.941 | 1591.176 |
| 130.00 MHz | 0.222 | 0.333 | 0.512 | 0.758 | 1.072 | 326.236 | 642.470 | 958.705 | 1274.940 | 1591.176 |
| 140.00 MHz | 0.229 | 0.358 | 0.566 | 0.851 | 1.215 | 326.236 | 642.470 | 958.705 | 1274.940 | 1591.176 |
| 150.00 MHz | 0.237 | 0.385 | 0.623 | 0.961 | 1.368 | 326.236 | 642.470 | 958.705 | 1274.940 | 1591.176 |
| 160.00 MHz | 0.245 | 0.414 | 0.685 | 1.057 | 1.532 | 326.236 | 642.470 | 958.705 | 1274.940 | 1591.176 |
| 170.00 MHz | 0.253 | 0.444 | 0.750 | 1.171 | 1.707 | 326.235 | 642.470 | 958.705 | 1274.940 | 1591.176 |
| 180.00 MHz | 0.263 | 0.476 | 0.819 | 1.291 | 1.892 | 326.235 | 642.470 | 958.705 | 1274.940 | 1591.175 |
| 190.00 MHz | 0.272 | 0.511 | 0.893 | 1.418 | 2.088 | 326.235 | 642.470 | 958.705 | 1274.940 | 1591.175 |

Advantageously, active circuit 21 can adjust the phase gain response on a reactive element to make negative reactive element (e.g., an inductor that has a decreasing impedance with respect to increasing frequency or a capacitor that has increasing impedance with respect to increasing frequency). In one embodiment, element 12 can be capacitor coupled in opposite phase to that shown in FIG. 3. Such a configuration allows a negative inductive effect to be obtained by adjusting the phase of the gain response on element 12. The negative inductor would behave oppositely to a conventional inductor but would have positive resistance like a conventional inductor. In another other embodiment, an inductor can be coupled in opposite phase to that shown in FIG. 3. Such a configuration allows a negative capacitive effect to be obtained.

Figure 7:
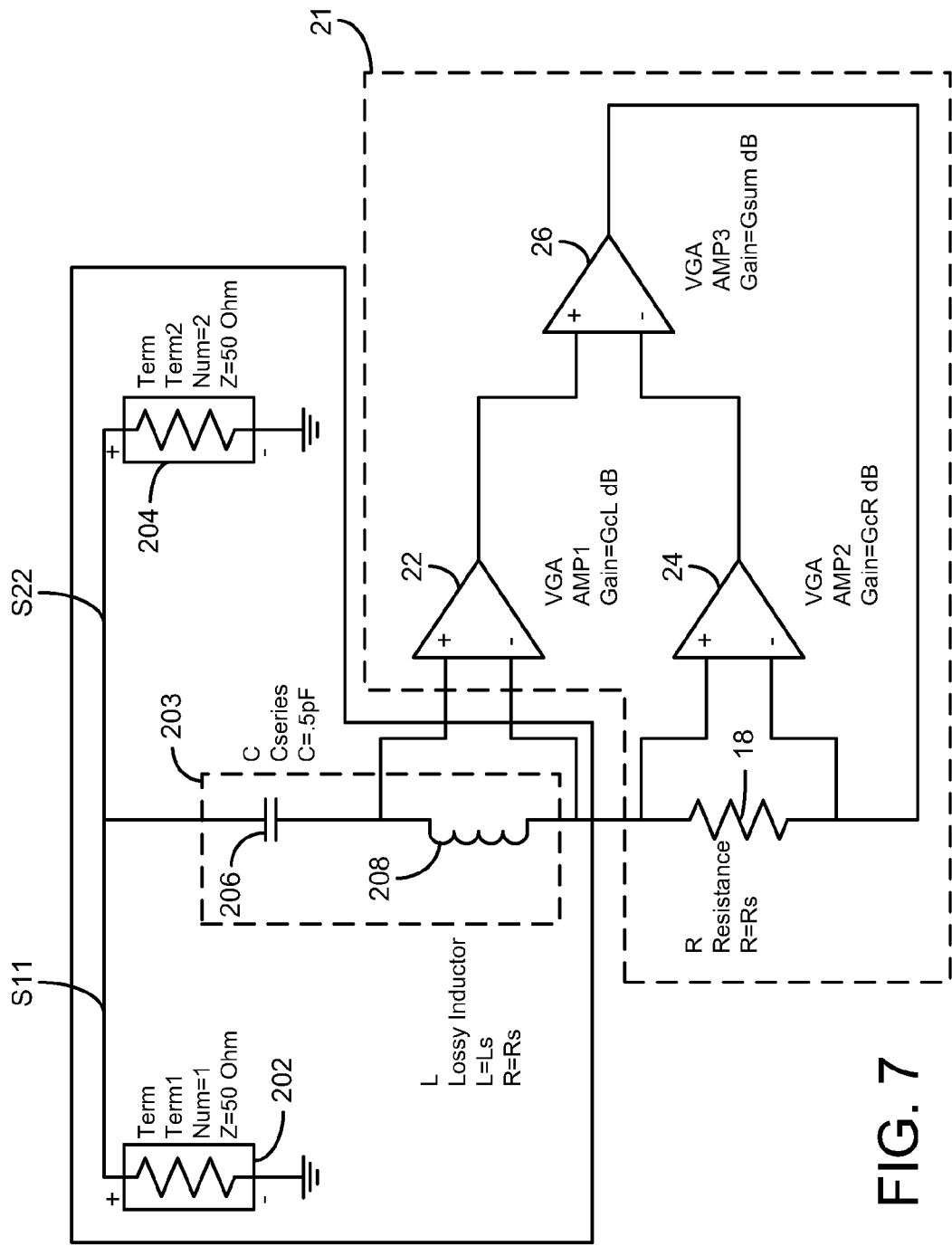
FIG. 7 is a schematic circuit waveform diagram showing a circuit for modifying impedance of a filter in accordance with an exemplary embodiment.

With reference to FIG. 7, a circuit 203 can be configured as a filter including passive elements 206 and 208 embodied as a capacitor 206 and an inductor 208. Circuit 203 is coupled to active circuit 21 which modifies the impedance. Circuit 203 can be embodied as any number of different types of circuits including passive elements, such as passive elements 206 and 208. Additional passive elements can also be included in circuit 203.

In one embodiment, circuit 203 is embodied as a notch filter for use between an antenna and receive/transmit circuit. In other embodiments, circuit 203 can be a snub filter, a band pass filter, an intermediate frequency filter, a radio frequency filter, a low pass filter, a high pass filter, etc. Circuit 203 can be utilized in various parts of a radio architecture.

Although two passive elements 206 and 208 are shown in an L-C configuration, filtering can be achieved using one or more series or parallel LC, LR, RC, or LRC configurations and various combinations of such configurations. The specific form of circuit 203 is not shown in a limiting fashion.

Active circuit 21 includes an element 18 such as a resistor having a resistance associated with the series resistance of element 208. The series resistance can be 10 ohms and the inductance of element 208 can be 10 nanohenrys in one example. The capacitance of capacitor 206 is set to 0.5 pico Farads (pF) in this example (but can be any value depending upon the filter design requirements). Measurement ports 202 and 204 represent the network analyzer measurement ports S11 and S22 and typically have a characteristic impedance of 50 ohms.

Active circuit 21 can remove the real portion of resistance associated with element 208 and amplify the inductance associated with element 208 in a process similar to the process discussed with reference to FIG. 3. In one embodiment, an additional active circuit 21 can be utilized to modify the impedance associated with passive element 206, embodied as a capacitor 206. Alternatively, resistance for both capacitors 206 and inductor 208 can be removed by using a resistor having a resistance related to the total resistance of 206 and 208 as element 18. Capacitance associated with capacitor 206 could be amplified using active circuit 21 in one embodiment.

With reference to FIG. 8, a Smith chart 250 shows impedance characteristics of circuit 203 at measurement port S11 for frequencies between 200 and 600 MhZ. With reference to FIG. 9, a Smith chart 260 shows impedance characteristics at port S22 for circuit 203 at frequencies between 200 and 600 MhZ. With reference to FIGS. 8 and 9, Smith charts 250 and 260 showing matching at 50 ohms for the passband frequencies across a range of 200-600 MHz except for the frequencies of the notch in the passband which presents a nearly perfect short to ground and prevents energy in a tunable, narrow band, from reaching the output (e.g., port S22).

With reference to FIG. 10, waveforms 280 show notch filter responses for circuit 203. Different notches 282 are achieved by adjusting gain and $G_{cL}$ and $G_{cR}$. Notches 282 are preferably sharper than conventional on-chip filters in one embodiment due to the actively modified Q factor of element 208.

As shown in FIG. 10, circuit 203 can operate as a variable notch filter. Responses 282 show the variable tuning ability of circuit 203 by adjusting gains $G_{cL}$ and $G_{cR}$. $G_{sum}$ can be set to 0 db in one embodiment.

Figure 11:
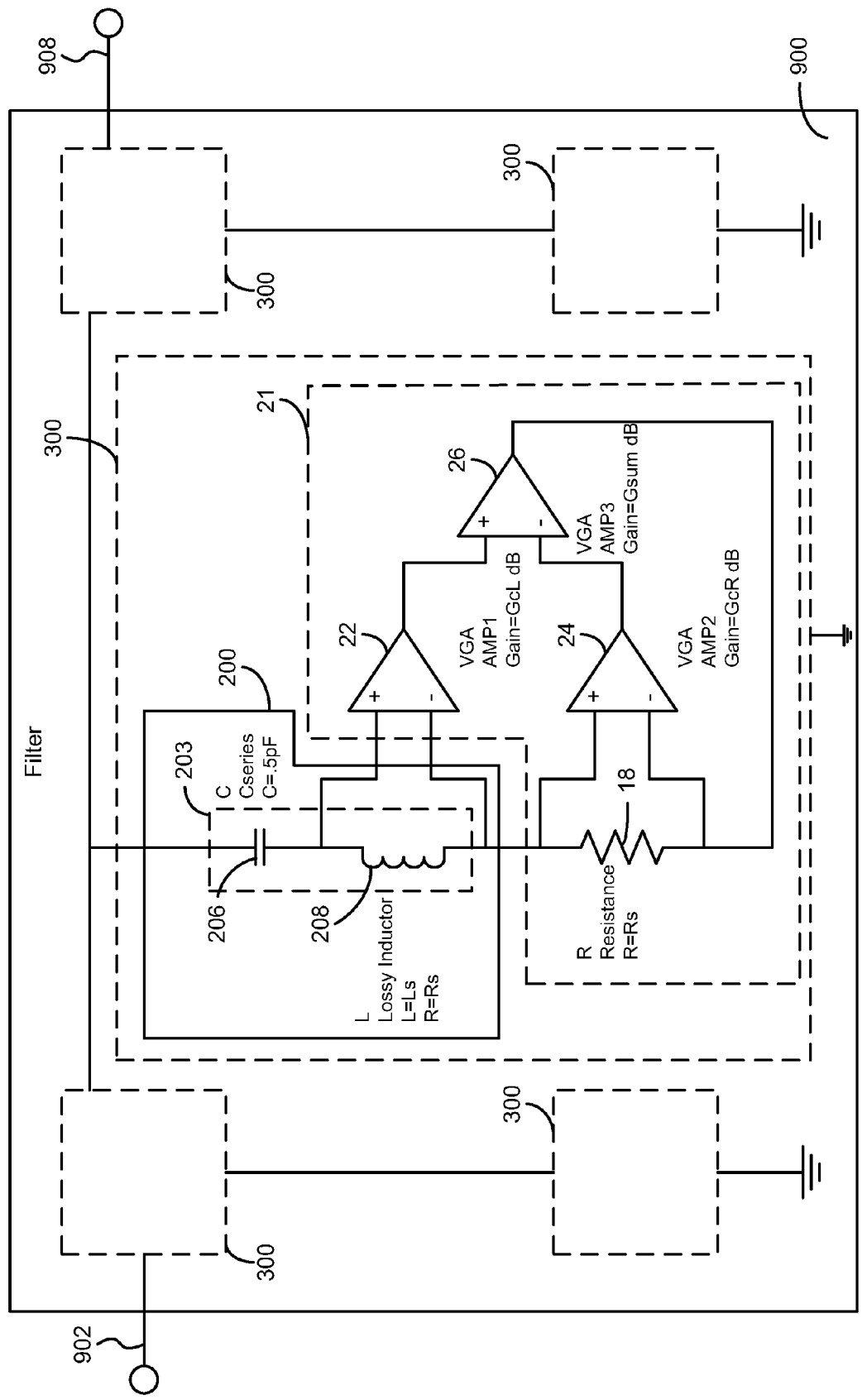
FIG. 11 is a schematic circuit diagram of a filter including modified impedance circuits according to yet another exemplary embodiment.

With reference to FIG. 11, a circuit 900 includes a number of circuits 300 interconnected to form an electrical device such a filter, sensor, communication circuit, etc. Circuit 300 can be interconnected in a variety of fashions, in series, in parallel and combinations thereof. Preferably, circuit 900 is a radio frequency circuit and circuits 300 modify impedance characteristics of passive circuit elements within them according to the principles described in this disclosure.

Passive circuit elements within each circuit 300 can include a capacitor 206 or inductor 208. Active circuit 21 can be utilized to control or to modify the impedance characteristics as discussed above with reference to FIGS. 2-8.

Device 900 can have an input 904 and an output 908. Circuits 300 can be interconnected in any of a variety of fashions to achieve the functions associated with device 900. In one embodiment, circuit 900 is a band pass filter. In another embodiment, filter 900 is an IF filter. Each circuit 300 can operate as a variable impedance device such as a variable resistor, variable capacitor or variable inductor. Variable impedance values can be obtained by adjusting gains associated with amplifiers 22, 24 and 26 in amplification circuit 21.

Each active circuit 21 can be designed in accordance with characteristics required for the particular circuit 300 or device 900. For example, amplification techniques more suitable for filter applications may be utilized when device 900 is a filter as opposed to when device 900 is another type of electrical device. Specific amplification circuits for each application are not described herein because the invention is applicable to such a vast variety of application and should not be limited to any particular configurations suitable for particular applications. The principles described herein can be applied to a vast array of applications and circuits for such applications.

In one embodiment, circuits 300 can be interconnected by fuses or transistors. The configuration can be programmable according to ASIC or programmable logic device (PLD) techniques.

The construction and arrangement of the components as shown in the various exemplary embodiments as illustrative only. Although several embodiments have been described in detail in this disclosure, those skilled in the art who review this disclosure will readily appreciate that many modifications are possible (e.g., variations in dimensions, circuit values, gains, circuit configurations, etc.) without materially departing from the novel teachings and advantages of the subject matter recited in the claims. For example, active circuit can include an arrangement of various numbers of amplifiers, transistors, diodes, resistors, capacitors and inductors without departing from the scope of the invention depending upon application criteria. Ports S11 and S22 are not discussed in a limiting fashion. Substitutions, modifications, changes in the circuit design, operating conditions and arrangements of the various exemplary embodiments can be made without departing from the scope of the present invention as expressed in the present claims.

What is claimed is:

1. An apparatus, comprising:
   a first passive element having an impedance;
   an active circuit configured to receive an impedance signal associated with the impedance, the impedance includes a real portion and an imaginary portion, wherein the active circuit is configured to increase or decrease the real portion or the imaginary portion of the impedance signal, wherein the active circuit is configured to amplify the impedance signal to provide a first amplified signal, wherein the active circuit includes a second passive element having a resistance, inductance or capacitance related to the real portion or the imaginary portion, wherein the active circuit is configured to provide a second amplified signal associated with the second passive element, wherein the active circuit is configured to combine the first amplified signal and the second amplified signal to provide a combined signal, wherein the combined signal increases or decreases the real portion or the imaginary portion of the impedance signal by at least partially removing or augmenting the real portion or the imaginary portion of the impedance signal.

2. An apparatus of claim 1, wherein a Q factor of the first passive element is modified with the active circuit.

3. The apparatus of claim 1, wherein the first passive element is an inductor or a capacitor on a same substrate as the active circuit.

4. The apparatus of in claim 1 wherein the first passive element is an on-die inductor.

5. The apparatus of claim 4, wherein the on-die inductor has a series resistance of Rs.

6. The apparatus in claim 5, wherein the second passive element of the active circuit is a resistor having the resistance of Rs.

7. The apparatus as claimed in claim 1, wherein the active circuit includes RF amplifier circuit arranged as a positive amplified impedance circuit, a negative amplifier resistance circuit and a summing circuit.

8. The apparatus as claimed in claim 1, further comprising a capacitor.

9. A radio, comprising:
   a set of variable gain amplifiers for receiving an impedance signal associated with a passive element and a real portion signal associated with the impedance signal, wherein the amplifiers provide a combination of an amplified version of the real portion signal and an amplified version of the impedance signal to provide a modified impedance signal having a reduced real portion.

10. The radio of in claim 9, wherein the set includes three differential amplifiers.

11. The radio of claim 10, wherein the set includes variable gain amplifiers having the same gain setting.

12. The radio of claim 9, wherein the passive element is an on-chip inductor.

13. The radio of claim 9, wherein the modified impedance signal is associated with a filter.

14. The radio of claim 13, wherein the set of amplifiers can adjust the impedance of the filter by adjusting at least one gain associated with the amplified version of the impedance signal.

15. The radio of claim 9, wherein the set of amplifiers includes at least two radio frequency amplifiers.

16. A method of adjusting impedance of a passive element, the method comprising:
   receiving a first impedance signal and providing a first amplified impedance signal;
   receiving a second impedance signal and providing a second amplified impedance signal, and
   summing the first amplified impedance signal and the second amplified impedance signal, wherein the summing step at least partially removes a real component of the first amplified impedance signal from the first amplified impedance signal.

17. The method of claim 16, wherein a summed signal from the summing step is used in a filter.

18. The method of claim 16, wherein the first impedance signal is provided by an on-chip inductor or capacitor.

19. The method of claim 18, wherein the real portion is related to the resistance of the inductor.

20. The method of claim 16, wherein the first amplified impedance signal and the second amplified impedance signal can be amplified at different gains to achieve a tunable filter.

21. An apparatus, comprising:
   a passive element consisting of an inductive element or a capacitive element; and
   an active circuit configured to provide a negative inductive effect for the passive element if the passive element is an inductive element or a negative capacitive effect for the passive element if the passive element is a capacitive element, wherein the active circuit is configured to amplify an impedance signal associated with the passive element to provide a first amplified signal, wherein the active circuit is configured to combine the first amplified signal and a second amplified signal to provide a combined signal, wherein the combined signal increases or decreases the imaginary portion of the impedance signal to achieve the negative inductive effect for the passive element if the passive element is an inductive element or the negative capacitive effect for the passive element if the passive element is a capacitive element.

* * * * *